(12) United States Patent
Chen (10) Patent No.: US 11,081,600 B2
(45) Date of Patent: Aug. 3, 2021

(54) LIGHT FILTER STRUCTURE

(71) Applicant: VisEra Technologies Company Limited, Hsin-Chu (TW)

(72) Inventor: Yu-Jen Chen, Taoyuan (TW)

(73) Assignee: VISERA TECHNOLOGIES COMPANY LIMITED, Hsin-Chu (TW)

(*) Notice: Subject to any disclaimer, the term of this patent is extended or adjusted under 35 U.S.C. 154(b) by 0 days.

(21) Appl. No.: 16/408,823

(22) Filed: May 10, 2019

(65) Prior Publication Data

US 2020/0357935 A1 Nov. 12, 2020

(51) Int. Cl.
*H01L 31/0216* (2014.01)
*G02B 5/28* (2006.01)

(52) U.S. Cl.
CPC ........ *H01L 31/02165* (2013.01); *G02B 5/285* (2013.01); *H01L 31/02164* (2013.01)

(58) Field of Classification Search
None
See application file for complete search history.

(56) References Cited

U.S. PATENT DOCUMENTS

| 2007/0058055 A1* | 3/2007 | Yamaguchi | H01L 31/02164 348/272 |
| 2014/0168761 A1* | 6/2014 | Ockenfuss | G02B 5/208 359/360 |
| 2016/0240683 A1* | 8/2016 | Miyake | H01L 27/124 |

FOREIGN PATENT DOCUMENTS

| JP | 1987-267623 | | 11/1987 |
| JP | 2005277404 | A | 10/2005 |
| JP | 2013044537 | A | 3/2013 |
| JP | 2015213144 | A | 11/2015 |
| JP | 2018116150 | A | 7/2018 |
| TW | 201600890 | A | 1/2016 |
| TW | I582983 | B | 5/2017 |
| WO | WO2016088216 | A1 | 6/2016 |

OTHER PUBLICATIONS

Office Action from the corresponding TW application No. 108136358 dated Jul. 3, 2020, 7 pages.
Japanese Office Action of its corresponding JP application No. 2019-172851 dated Oct. 20, 2020 with its English translation; pp. 1-9.

\* cited by examiner

*Primary Examiner* — Michelle Mandala
(74) *Attorney, Agent, or Firm* — Muncy, Geissler, Olds & Lowe, P.C.

(57) ABSTRACT

A light filter structure is provided. The light filter structure includes a substrate having a plurality of photoelectric conversion elements. The light filter structure also includes a dielectric-stacking layer disposed on the substrate. The light filter structure further includes a flattening layer disposed on the dielectric-stacking layer. The dielectric-stacking layer has a wedge portion and a flattening portion adjacent to the wedge portion, the wedge portion has a continuously or non-continuously varied thickness, and the flattening portion has a substantially constant thickness.

20 Claims, 7 Drawing Sheets

LIGHT FILTER STRUCTURE

BACKGROUND

Technical Field

Embodiments of the present disclosure relate to a light filter structure. More specifically, the present disclosure relates to a light filter structure that includes a dielectric-stacking layer.

Description of the Related Art

Light filters have been widely used in various devices, such as spectrum meters, ambient light sensors, color sensors, image sensors, spectral inspection devices, and so on. However, traditional light filter structures may not satisfy demands in every respect. For example, the spectrum obtained from the traditional light filter structure may have unexpected deformation due to oblique incident-light. Furthermore, it is hard to reduce the size of the traditional light filter structure to, for example, a few micrometers to meet demand.

SUMMARY

In accordance with some embodiments of the present disclosure, a light filter structure is provided. The light filter structure includes a substrate having a plurality of photoelectric conversion elements. The light filter structure also includes a dielectric-stacking layer disposed on the substrate. The light filter structure further includes a flattening layer disposed on the dielectric-stacking layer. The dielectric-stacking layer has a wedge portion and a flattening portion adjacent to the wedge portion, the wedge portion has a continuously or non-continuously varied thickness, and the flattening portion has a substantially constant thickness.

BRIEF DESCRIPTION OF THE DRAWINGS

Aspects of the embodiments of the present disclosure may be understood from the following detailed description when reading with the accompanying figures. It should be noted that, in accordance with the standard practice in the industry, various features are not drawn to scale. In fact, the dimensions of the various features may be arbitrarily increased or reduced for easy and clear discussion.

DETAILED DESCRIPTION

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

It should be understood that additional steps may be implemented before, during, or after the illustrated methods, and some steps might be replaced or omitted in other embodiments of the illustrated methods.

Furthermore, spatially relative terms, such as "beneath," "below," "lower," "on," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 45 degrees or at other orientations) and the spatially relative descriptors used herein may likewise be interpreted accordingly.

In the present disclosure, the terms "about" and "substantially" typically mean +/−20% of the stated value, more typically +/−10% of the stated value, more typically +/−5% of the stated value, more typically +/−3% of the stated value, more typically +/−2% of the stated value, more typically +/−1% of the stated value and even more typically +/−0.5% of the stated value. The stated value of the present disclosure is an approximate value. That is, when there is no specific description of the terms "about" and "substantially", the stated value still includes the meaning of "about" or "substantially".

It should be understood that, although the terms "first," "second," "third," etc. can be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Unless otherwise defined, all terms (including technical and scientific terms) used herein have the same meaning as commonly understood by one of ordinary skill in the art to which this disclosure belongs. It should be understood that terms such as those defined in commonly used dictionaries should be interpreted as having a meaning that is consistent with their meaning in the context of the relevant art and will not be interpreted in an idealized or overly formal sense unless expressly so defined in the embodiments of the present disclosure.

Figure 1:
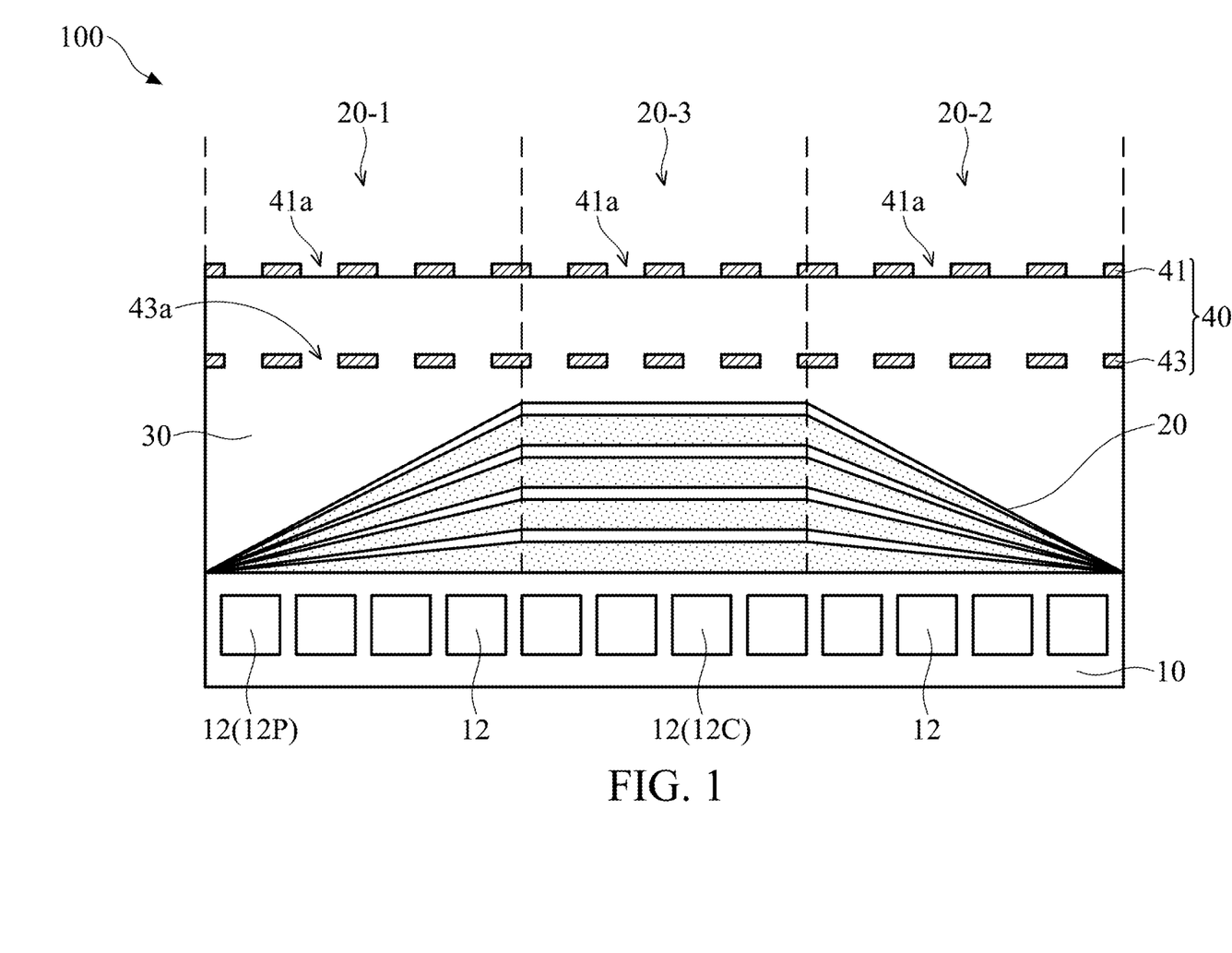
FIG. 1 is a partial cross-sectional view illustrating a light filter structure according to one embodiment of the present disclosure.
Figure 2:
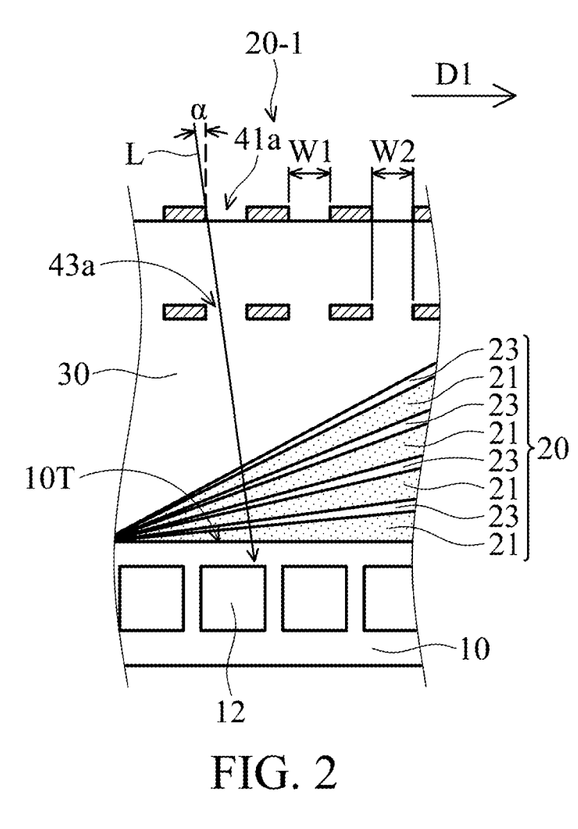
FIG. 2 is a partial enlargement illustrating the light filter structure according to one embodiment of the present disclosure.

FIG. 1 is a partial cross-sectional view illustrating a light filter structure 100 according to one embodiment of the present disclosure. FIG. 2 is a partial enlargement illustrating the light filter structure 100 according to one embodiment of the present disclosure. It should be noted that not all components of the light filter structure 100 are shown in FIG. 1 and FIG. 2, for the sake of brevity.

Referring to FIG. 1, the light filter structure 100 includes a substrate 10. In some embodiments, the material of the substrate 10 may include an elemental semiconductor (e.g., silicon, germanium), a compound semiconductor (e.g., tantalum carbide (TaC), gallium arsenide (GaAs), indium arsenide (InAs) or indium phosphide (InP)), an alloy semiconductor (e.g., silicon germanium (SiGe), silicon germanium carbide (SiGeC), gallium arsenic phosphide (GaAsP) or gallium indium phosphide (GaInP)), any other applicable semiconductor, or a combination thereof, but the present disclosure is not limited thereto.

In some embodiments, the substrate 10 may be a semiconductor-on-insulator (SOI) substrate. The semiconductor-on-insulator substrate may include a bottom substrate, a buried oxide layer disposed on the bottom substrate, and a semiconductor layer disposed on the buried oxide layer. In some embodiments, the substrate 10 may be a semiconductor wafer (e.g., a silicon wafer, or any other applicable semiconductor wafer). In some embodiments, the material of the substrate 10 may include, but is not limited to, at least one of the following: ceramic, glass, polyimide (PI), liquid-crystal polymer (LCP), polycarbonate (PC), polypropylene (PP), polyethylene terephthalate (PET) (and other plastic), a polymer material, or a combination thereof.

In some embodiments, the substrate 10 may include various conductive features (e.g., conductive lines or vias). For example, the conductive features may be made of aluminum (Al), copper (Cu), tungsten (W), an alloy thereof, any other applicable conductive material, or a combination thereof, but the present disclosure is not limited thereto.

As shown in FIG. 1, the substrate 10 may have a plurality of photoelectric conversion elements 12. In some embodiments, the photoelectric conversion elements 12 may be formed by a process such as an ion implantation process and/or a diffusion process. For example, the photoelectric conversion elements 12 may be configured to form transistors, photodiodes, PIN diodes and/or light-emitting diodes, but the present disclosure is not limited thereto.

Referring to FIG. 1 and FIG. 2, the light filter structure 100 includes a dielectric-stacking layer 20 disposed on the substrate 10. In this embodiment, the dielectric-stacking layer 20 may include a wedge portion 20-1 and a flattening portion 20-3 adjacent to the wedge portion 20-1 as shown in FIG. 1. In some embodiments, the wedge portion 20-1 may have a continuously varied thickness, and the flattening portion 20-3 may have a substantially constant thickness, but the present disclosure is not limited thereto. Here, the continuously varied thickness may refer to the thickness that varies continuously. In some embodiments, the wedge portion 20-1 may have a non-continuously varied thickness. Here, the non-continuously varied thickness may refer to the thickness that varies non-continuously.

In some embodiments, the dielectric-stacking layer 20 may include alternately stacked first dielectric layers 21 and second dielectric layers 23 as shown in FIG. 1 and FIG. 2, and the refractive index of each of the first dielectric layers 21 may be different from the refractive index of each of the second dielectric layers 23. For example, the refractive index of the first dielectric layer 21 may be greater than the refractive index of the second dielectric layer 23, but the present disclosure is not limited thereto. In other embodiments, the refractive index of the first dielectric layer 21 may be less than the refractive index of the second dielectric layer 23.

In some embodiments, the refractive index of the first dielectric layer 21 may be between about 2 and about 2.5, and the material of the first dielectric layer 21 may include zirconium dioxide ($ZrO_2$), tantalum pentoxide ($Ta_2O_5$), niobium pentoxide ($Nb_2O_5$), zinc sulfide (ZnS), titanium dioxide ($TiO_2$), indium tin oxide (ITO), Tin oxide ($SnO_2$), zinc oxide (ZnO), or any other applicable material, but the present disclosure is not limited thereto. In some embodiments, the refractive index of the second dielectric layer 23 may be between about 1.2 and about 1.8, and the material of the second dielectric layer 23 may include calcium fluoride ($CaF_2$), magnesium fluoride ($MgF_2$), lanthanum trifluoride ($LaF_3$), silicon dioxide ($SiO_2$), aluminium oxide ($Al_2O_3$), hafnium dioxide ($HfO_2$), or any other applicable material, but the present disclosure is not limited thereto.

In FIG. 1 and FIG. 2, the dielectric-stacking layer 20 includes four first dielectric layers 21 and four second dielectric layers 23 disposed on the substrate 10, but the number of first dielectric layers 21 and the number of second dielectric layers 23 are not limited thereto. In some embodiments, the first dielectric layers 21 and the second dielectric layers 23 may be formed by a chemical vapor deposition process, an atomic layer deposition process, a physical vapor deposition process, or another suitable method, but the present disclosure is not limited thereto. For example, the chemical vapor deposition process may be low-pressure chemical vapor deposition, low-temperature chemical vapor deposition, rapid thermal chemical vapor deposition, or plasma-enhanced chemical vapor deposition.

Moreover, the dielectric-stacking layer 20 may be deposited on the substrate 10 by using a specific mask to form the wedge portion 20-1 (and the flattening portion 20-3), wherein the wedge portion 20-1 may have a continuously varied thickness, but the present disclosure is not limited thereto. Furthermore, in some embodiments, each of the first dielectric layers 21 in the wedge portion 20-1 may correspondingly have a continuously varied thickness, and each of the second dielectric layers 23 in the wedge portion 20-1 may correspondingly have a continuously varied thickness as shown in FIG. 1 and FIG. 2, but the present disclosure is not limited thereto.

In some embodiments, the wedge portion 20-1 of the dielectric-stacking layer 20 may gradually thin from the side close to the flattening portion 20-3 to the side farther away from the flattening portion 20-3 as shown in FIG. 1 and FIG. 2. That is, the thickness of the wedge portion 20-1 close to the flattening portion 20-3 may be greater than the thickness of the wedge portion 20-1 farther away from the flattening portion 20-3. However, the present disclosure is not limited thereto.

Correspondingly, each of the first dielectric layers 21 in the wedge portion 20-1 may gradually thin from the side close to the flattening portion 20-3 to the side farther away from the flattening portion 20-3, and each of the second dielectric layers 23 in the wedge portion 20-1 may gradually thin from the side close to the flattening portion 20-3 to the side farther away from the flattening portion 20-3 as shown in FIG. 1 and FIG. 2. That is, in the wedge portion 20-1, the thickness of the first dielectric layers 21 close to the flattening portion 20-3 may be greater than the thickness of the first dielectric layers 21 farther away from the flattening portion 20-3, and the thickness of the second dielectric layers 23 close to the flattening portion 20-3 may be greater than the thickness of the second dielectric layers 23 farther away from the flattening portion 20-3. However, the present disclosure is not limited thereto.

In this embodiment, the dielectric-stacking layer 20 may further include another wedge portion 20-2 adjacent to the flattening portion 20-3; that is, the wedge portion 20-1 may be disposed on one side of the flattening portion 20-3, and the wedge portion 20-2 may be disposed on another side of the flattening portion 20-3 as shown in FIG. 1. In some embodiments, the wedge portion 20-2 may be similar to the wedge portion 20-1. For example, the wedge portion 20-2 may have a continuously varied thickness, and the wedge portion 20-2 may be symmetrical to the wedge portion 20-1, but the present disclosure is not limited thereto. In other embodiments, the wedge portion 20-2 may have a non-continuously varied thickness, or the wedge portion 20-2 may be asymmetrical to the wedge portion 20-1 (e.g., the width of the wedge portion 20-2 may be greater or less than the width of the wedge portion 20-1).

Referring to FIG. 1 and FIG. 2, the light filter structure 100 includes a flattening layer 30 disposed on the dielectric-stacking layer 20. In this embodiment, the flattening layer 30 may be a transparent layer, and the material of the flattening layer 30 may include a transparent photoresist, polyimide, epoxy resin, any other applicable material, or a combination thereof, but the present disclosure is not limited thereto.

In some embodiments, the material of the flattening layer 30 may include a light curing material, a thermal curing material, or a combination thereof. For example, a spin-on coating process may be performed to coat the transparent material on the dielectric-stacking layer 20, and then a planarization process may be performed to form the flattening layer 30, but the present disclosure is not limited thereto. For example, the planarization process may include a chemical mechanical polishing (CMP) process, a grinding process, an etching back process, any other applicable process, or a combination thereof.

Referring to FIG. 1 and FIG. 2, in some embodiments, the light filter structure 100 may further include a first light-shielding layer 41 disposed on the flattening layer 30. As shown in FIG. 1 and FIG. 2, the first light-shielding layer 41 may include a plurality of apertures 41*a*. In some embodiments, each of the apertures 41*a* may correspond to one of the photoelectric conversion elements 12, but the present disclosure is not limited thereto.

In some embodiments, the material of the first light-shielding layer 41 may include photoresist (e.g., black photoresist, or other applicable photoresist which is not transparent), ink (e.g., black ink, or other applicable ink which is not transparent), molding compound (e.g., black molding compound, or other applicable molding compound which is not transparent), solder mask (e.g., black solder mask, or other applicable solder mask which is not transparent), (black-)epoxy polymer, any other applicable material, or a combination thereof. In some embodiments, the material of the first light-shielding layer 41 may include a light curing material, a thermal curing material, or a combination thereof, but the present disclosure is not limited thereto.

In some embodiments, the first light-shielding layer 41 may be formed on the flattening layer 30 by a coating process or a patterning process. In some embodiments, the patterning process may include soft baking, mask aligning, exposure, post-exposure baking, developing, rinsing, drying, any other applicable process, or a combination thereof, but the present disclosure is not limited thereto.

Moreover, in some embodiments, the light filter structure 100 may further include at least one second light-shielding layer 43 disposed inside the flattening layer 30 and on the dielectric-stacking layer 20. As shown in FIG. 1 and FIG. 2, the second light-shielding layer 43 may include a plurality of apertures 43*a*. In some embodiments, each of the apertures 43*a* may correspond to one of the photoelectric conversion elements 12, but the present disclosure is not limited thereto.

Similarly, the material of the second light-shielding layer 43 may include photoresist (e.g., black photoresist, or other applicable photoresist which is not transparent), ink (e.g., black ink, or other applicable ink which is not transparent), molding compound (e.g., black molding compound, or other applicable molding compound which is not transparent), solder mask (e.g., black solder mask, or other applicable solder mask which is not transparent), (black-)epoxy polymer, any other applicable material, or a combination thereof. In some embodiments, the material of the second light-shielding layer 43 may include a light curing material, a thermal curing material, or a combination thereof, but the present disclosure is not limited thereto.

In some embodiments, the second light-shielding layer 43 may be formed by a coating process or a patterning process. In some embodiments, the patterning process may include soft baking, mask aligning, exposure, post-exposure baking, developing, rinsing, drying, any other applicable process, or a combination thereof, but the present disclosure is not limited thereto. For example, the transparent material (e.g., transparent photoresist, polyimide or epoxy resin) may be formed on the dielectric-stacking layer 20; then, the non-transparent material (e.g., photoresist, ink, molding compound, solder mask or (black-)epoxy polymer) may be coated on the transparent material; next, the non-transparent material may be patterned to form the second light-shielding layer 43 with the apertures 43*a*; then, the transparent material may fill into the apertures 43*a* and may be disposed on the second light-shielding layer 43; next, the non-transparent material may be coated again on the transparent material; then, the non-transparent material may be patterned to form the first light-shielding layer 41 with the apertures 41*a*, but the present disclosure is not limited thereto.

In some embodiments, the first apertures 41*a* of the first light-shielding layer 41 may correspond to the second apertures 43*a* of the second light-shielding layer 43 as shown in FIG. 1 and FIG. 2, but the present disclosure is not limited thereto.

In some embodiments, the width W1 of each of the apertures 41*a* in a direction D1 parallel with a top surface 10T of the substrate 10 may be greater than 1 μm and less than 150 μm, and the width W2 of each of the apertures 43*a* in the direction D1 parallel with a top surface 10T of the substrate 10 may be greater than 1 μm and less than 150 μm as shown in FIG. 2, but the present disclosure is not limited thereto. In this embodiment, the width W1 of each of the apertures 41*a* is illustrated the same as the width W2 of each of the apertures 43*a* as shown in FIG. 1 and FIG. 2, but the present disclosure is not limited thereto. In some embodiments, the width W1 of each of the apertures 41*a* may be different from the width W2 of each of the apertures 43*a*. For example, the width W1 of each of the apertures 41*a* may be greater than the width W2 of each of the apertures 43*a* depending on demand.

It should be noted that the number of light-shielding layers (40) is not limited to the example shown in FIG. 1 and FIG. 2. In some embodiments, the number of second light-shielding layer 43 may be two or more than two, for example. The two or more light-shielding layers (40) may limit the incident angle of each incident light. For example, the incident angle of each incident light may be restricted to be less than 10°. That is, the first apertures 41a of the first light-shielding layer 41 and the second apertures 43a of the second light-shielding layer 43 may limit the incident angle α of light L to between 0 and 10° as shown in FIG. 2, but the present disclosure is not limited thereto. Therefore, the light filter structure 100 may be low angle dependency. That is, the deformation of the spectrum due to oblique incident-light transmitted to the light filter structure 100 may be reduced.

Moreover, when the light filter structure 100 is used in the spectral inspection device, the spectral resolution may be determined by the sizes of the first apertures 41a of the first light-shielding layer 41 and the second apertures 43a of the second light-shielding layer 43. That is, the spectral resolution may be enhanced by adjusting the sizes of the first apertures 41a of the first light-shielding layer 41 and the second apertures 43a of the second light-shielding layer 43.

In some embodiments, the wavelength of the light transmitted to the photoelectric conversion elements 12 may depend on the thickness the dielectric-stacking layer 20. For example, among the photoelectric conversion elements 12 that correspond to the wedge portion 20-1, the closer a photoelectric conversion element 12 is to the flattening portion 20-3, the longer the wavelength of the light transmitted to the photoelectric conversion element 12 is; the wavelength of the light transmitted to the photoelectric conversion elements 12 that correspond to the flattening portion 20-3 are greater than the wavelength of the light transmitted to the photoelectric conversion elements 12 that correspond to wedge portion 20-1 in the embodiment shown in FIG. 1 and FIG. 2. Therefore, the red light may be transmitted to the photoelectric conversion element 12C, and the blue light may be transmitted to the photoelectric conversion element 12P as shown in FIG. 1, but the present disclosure is not limited thereto.

Figure 3:
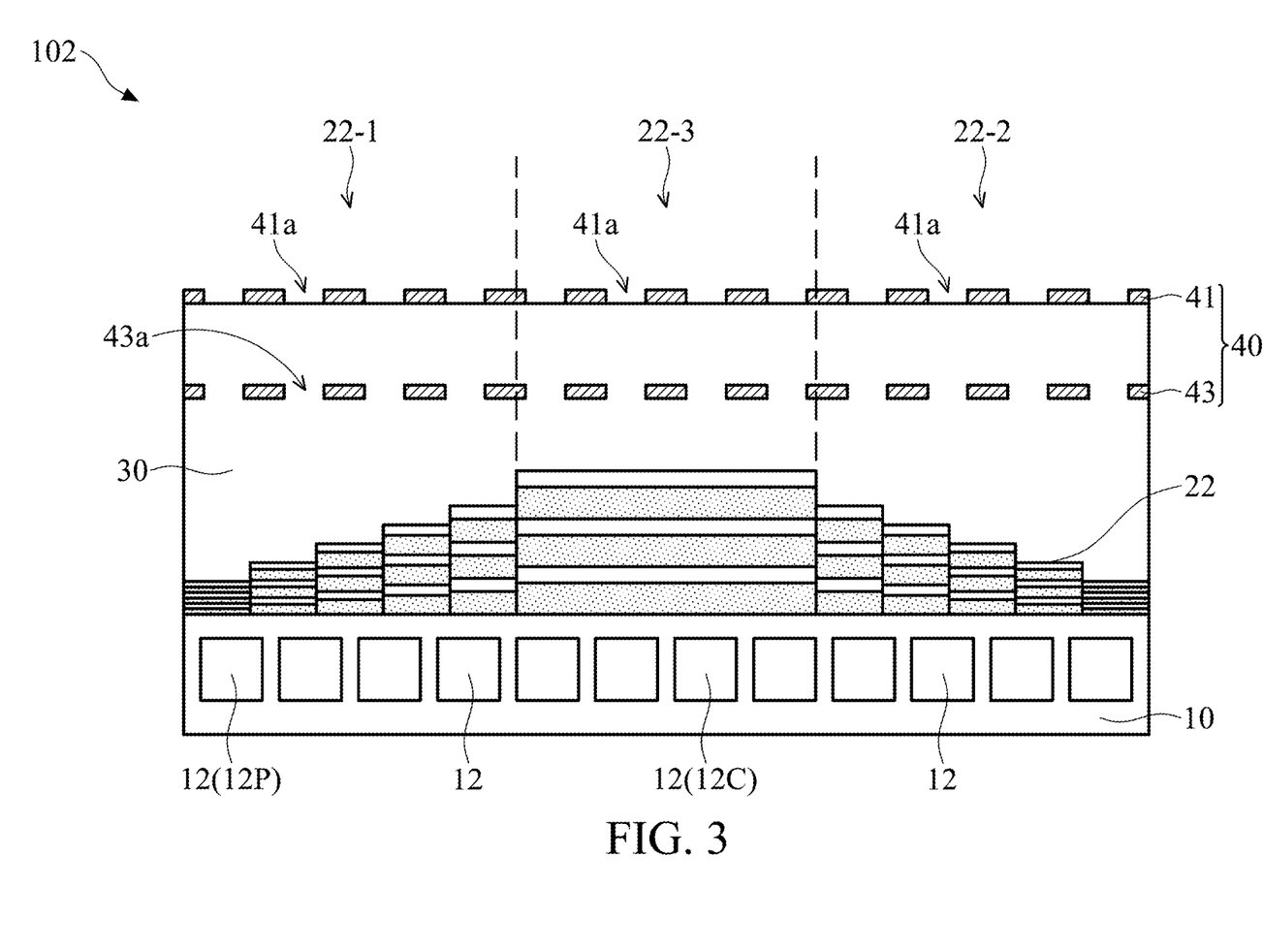
FIG. 3 is a partial cross-sectional view illustrating a light filter structure according to another embodiment of the present disclosure.
Figure 4:
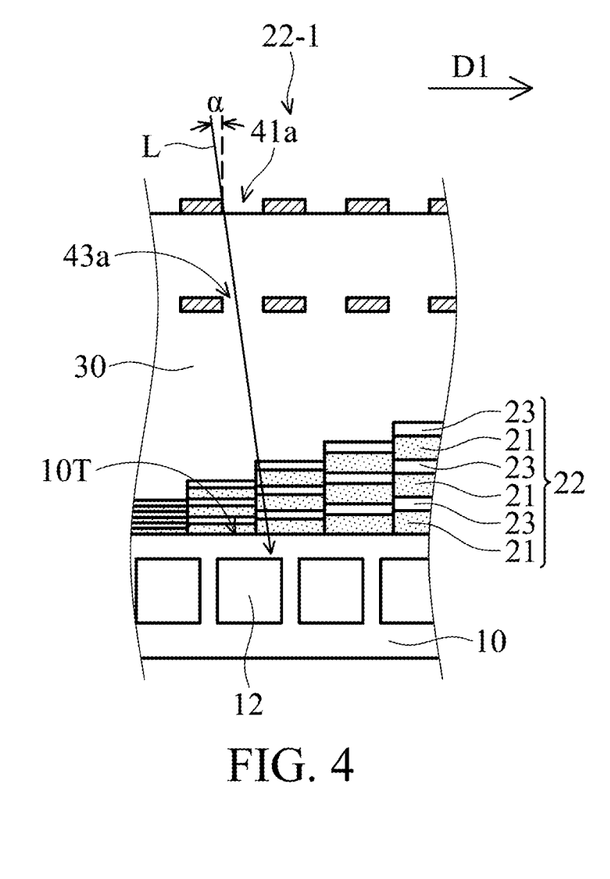
FIG. 4 is a partial enlargement illustrating the light filter structure according to the embodiment of the present disclosure.

FIG. 3 is a partial cross-sectional view illustrating a light filter structure 102 according to another embodiment of the present disclosure. FIG. 4 is a partial enlargement illustrating the light filter structure 102 according to the embodiment of the present disclosure. It should be noted that not all components of the light filter structure 102 are shown in FIG. 3 and FIG. 4, for the sake of brevity.

Referring to FIG. 3 and FIG. 4, the light filter structure 102 includes a substrate 10. Similarly, the substrate 10 may have a plurality of photoelectric conversion elements 12. The light filter structure 102 includes a dielectric-stacking layer 22 disposed on the substrate 10. In this embodiment, the dielectric-stacking layer 22 may include a wedge portion 22-1 and a flattening portion 22-3 adjacent to the wedge portion 22-1 as shown in FIG. 3. The light filter structure 102 further includes a flattening layer 30 disposed on the dielectric-stacking layer 22.

The differences from the light filter structure 100 shown in FIG. 1 and FIG. 2 may include that the wedge portion 22-1 of the dielectric-stacking layer 22 shown in FIG. 3 and FIG. 4 may have a non-continuously varied thickness. Here, the non-continuously varied thickness may refer to the thickness that varies non-continuously. For example, the wedge portion 22-1 of the dielectric-stacking layer 22 may have a step shape, but the present disclosure is not limited thereto.

Similarly, the dielectric-stacking layer 22 may include alternately stacked first dielectric layers 21 and second dielectric layers 23 as shown in FIG. 3 and FIG. 4, and the refractive index of each of the first dielectric layers 21 may be different from the refractive index of each of the second dielectric layers 23. For example, the refractive index of the first dielectric layer 21 may be greater than the refractive index of the second dielectric layer 23, but the present disclosure is not limited thereto. In other embodiments, the refractive index of the first dielectric layer 21 may be less than the refractive index of the second dielectric layer 23.

In FIG. 3 and FIG. 4, the dielectric-stacking layer 22 includes three first dielectric layers 21 and three second dielectric layers 23 disposed on the substrate 10, but the number of first dielectric layers 21 and the number of second dielectric layers 23 are not limited thereto. In some embodiments, the number of first dielectric layers 21 and the number of second dielectric layers 23 may be adjusted depending on demand.

In some embodiments, the wedge portion 22-1 of the dielectric-stacking layer 22 may gradually (but non-continuously) thin from the side close to the flattening portion 22-3 to the side farther away from the flattening portion 22-3 as shown in FIG. 3 and FIG. 4. That is, the thickness of the wedge portion 22-1 close to the flattening portion 22-3 may be greater than the thickness of the wedge portion 22-1 farther away from the flattening portion 22-3. However, the present disclosure is not limited thereto.

Correspondingly, each of the first dielectric layers 21 in the wedge portion 22-1 may gradually (but non-continuously) thin from the side close to the flattening portion 22-3 to the side farther away from the flattening portion 22-3, and each of the second dielectric layers 23 in the wedge portion 22-1 may gradually (but non-continuously) thin from the side close to the flattening portion 22-3 to the side farther away from the flattening portion 22-3 as shown in FIG. 3 and FIG. 4. That is, in the wedge portion 22-1, the thickness of the first dielectric layers 21 close to the flattening portion 22-3 may be greater than the thickness of the first dielectric layers 21 farther away from the flattening portion 22-3, and the thickness of the second dielectric layers 23 close to the flattening portion 22-3 may be greater than the thickness of the second dielectric layers 23 farther away from the flattening portion 22-3. However, the present disclosure is not limited thereto.

Similarly, the dielectric-stacking layer 22 may further include another wedge portion 22-2 adjacent to the flattening portion 22-3; that is, the wedge portion 22-1 may be disposed on one side of the flattening portion 22-3, and the wedge portion 22-2 may be disposed on another side of the flattening portion 22-3 as shown in FIG. 3. In some embodiments, the wedge portion 22-2 may be similar to the wedge portion 22-1. For example, the wedge portion 22-2 may have a non-continuously varied thickness, and the wedge portion 22-2 may be symmetrical to the wedge portion 22-1, but the present disclosure is not limited thereto. In other embodiments, the wedge portion 22-2 may be similar to the wedge portion 20-2 (which has a continuously varied thickness) shown in FIG. 1, or the wedge portion 22-2 may be asymmetrical to the wedge portion 22-1 (e.g., the width of the wedge portion 22-2 may be greater or less than the width of the wedge portion 22-1).

Referring to FIG. 3 and FIG. 4, in some embodiments, the light filter structure 102 may further include a first light-shielding layer 41 disposed on the flattening layer 30 and at least one second light-shielding layer 43 disposed inside the flattening layer 30 and on the dielectric-stacking layer 22.

As shown in FIG. 3 and FIG. 4, the first light-shielding layer 41 may include a plurality of apertures 41a, and the second light-shielding layer 43 may include a plurality of apertures 43a. In some embodiments, each of the apertures 41a and each of the apertures 43a may correspond to one of the photoelectric conversion elements 12, but the present disclosure is not limited thereto. In some embodiments, the first apertures 41a of the first light-shielding layer 41 may correspond to the second apertures 43a of the second light-shielding layer 43 as shown in FIG. 3 and FIG. 4, but the present disclosure is not limited thereto.

Similarly, when the light filter structure 102 is used in the spectral inspection device, the spectral resolution may be determined by the sizes of the first apertures 41a of the first light-shielding layer 41 and the second apertures 43a of the second light-shielding layer 43. That is, the spectral resolution may be enhanced by adjusting the sizes of the first apertures 41a of the first light-shielding layer 41 and the second apertures 43a of the second light-shielding layer 43.

In some embodiments, the wavelength of the light transmitted to the photoelectric conversion elements 12 may depend on the thickness the dielectric-stacking layer 22. For example, among the photoelectric conversion elements 12 that correspond to the wedge portion 22-1, the closer a photoelectric conversion element 12 is to the flattening portion 22-3, the longer the wavelength of the light transmitted to the photoelectric conversion element 12 is; the wavelength of the light transmitted to the photoelectric conversion elements 12 that correspond to the flattening portion 22-3 are greater than the wavelength of the light transmitted to the photoelectric conversion elements 12 that correspond to wedge portion 22-1 in the embodiment shown in FIG. 3 and FIG. 4. Therefore, the red light may be transmitted to the photoelectric conversion element 12C, and the blue light may be transmitted to the photoelectric conversion element 12P as shown in FIG. 3, but the present disclosure is not limited thereto.

Figure 5:
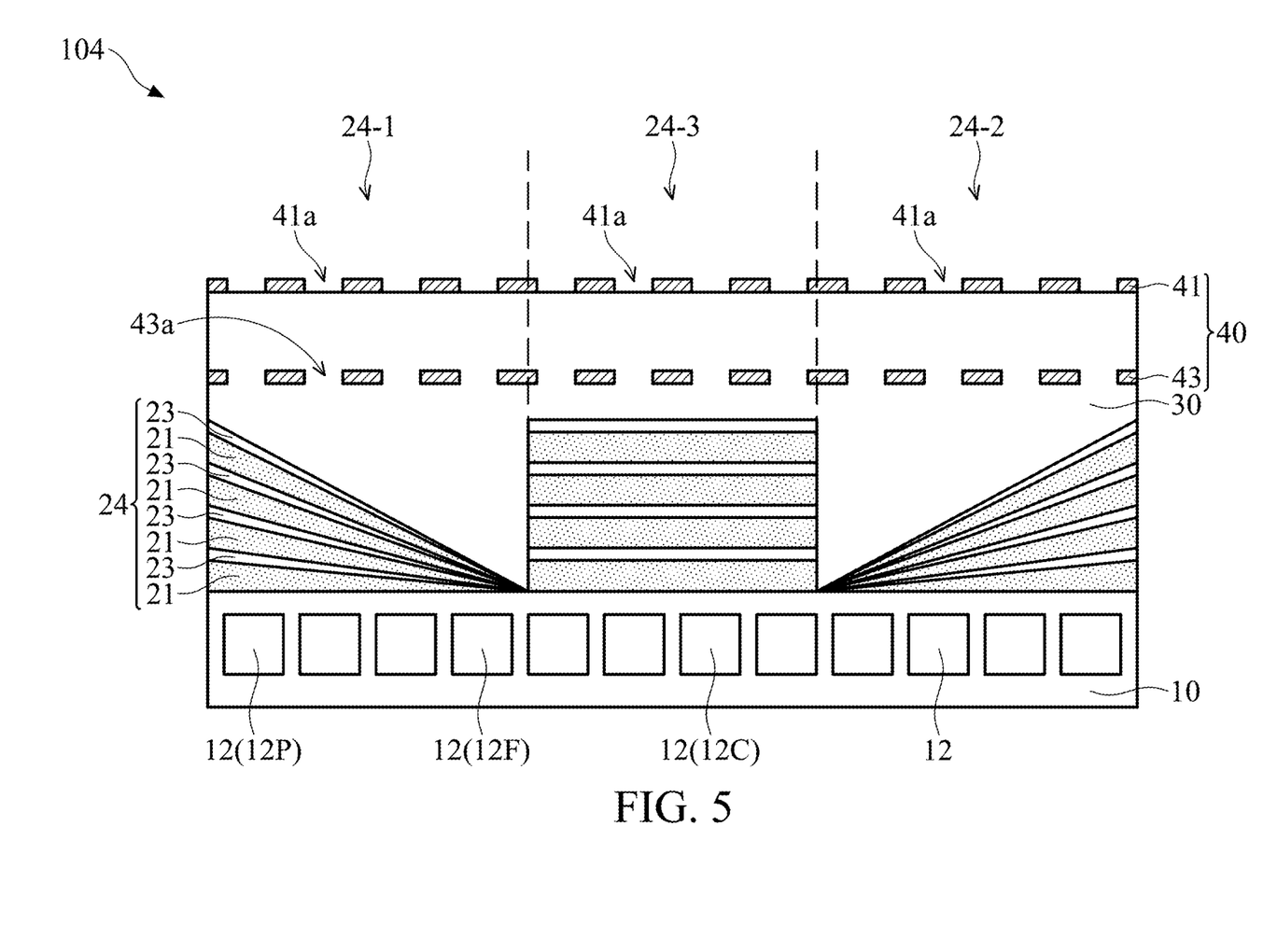
FIG. 5 is a partial cross-sectional view illustrating a light filter structure according to one embodiment of the present disclosure.
Figure 6:
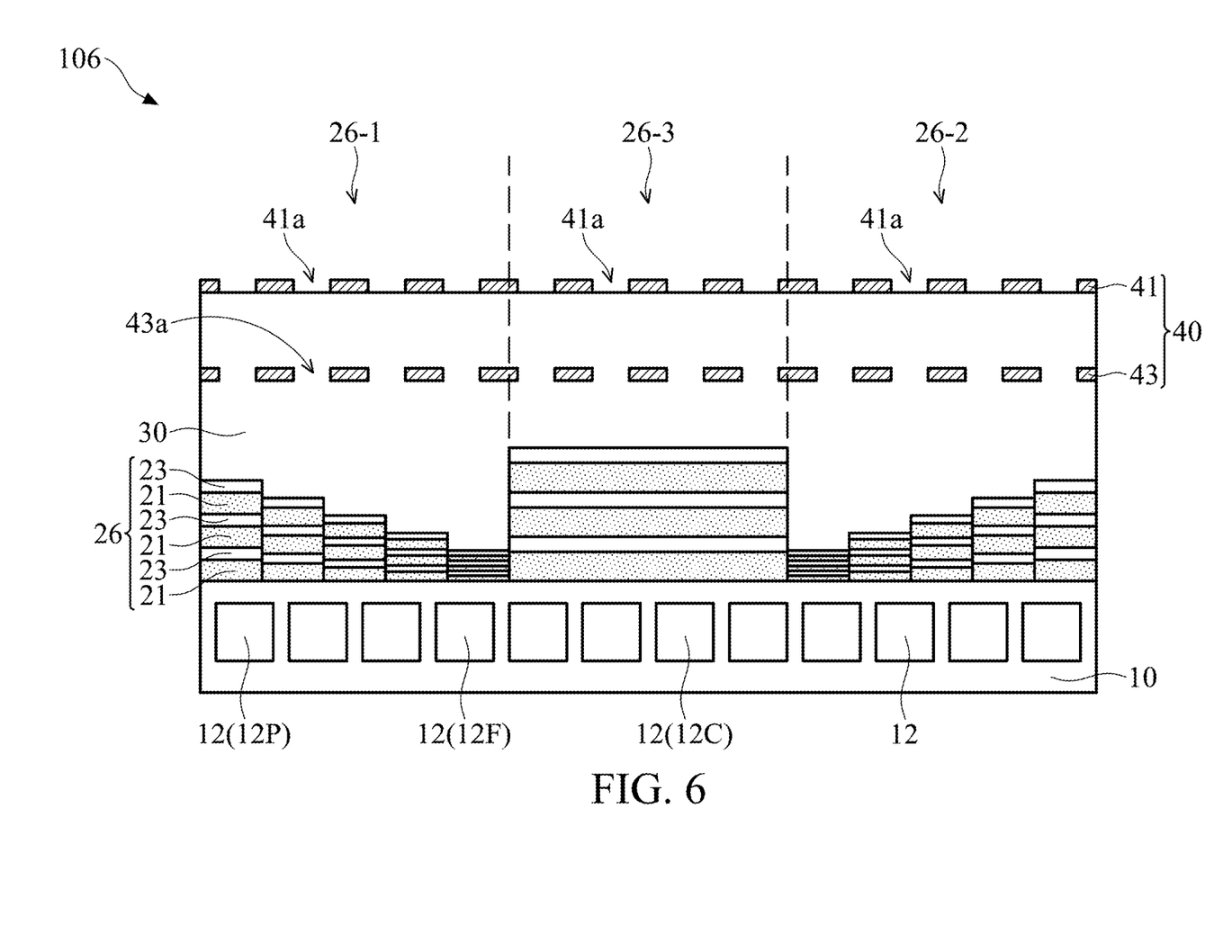
FIG. 6 is a partial cross-sectional view illustrating a light filter structure according to another embodiment of the present disclosure.

FIG. 5 is a partial cross-sectional view illustrating a light filter structure 104 according to one embodiment of the present disclosure. FIG. 6 is a partial cross-sectional view illustrating a light filter structure 106 according to another embodiment of the present disclosure. It should be noted that not all components of the light filter structure 104 and the light filter structure 106 are shown in FIG. 5 and FIG. 6, for the sake of brevity.

Referring to FIG. 5, the light filter structure 104 includes a substrate 10. Similarly, the substrate 10 may have a plurality of photoelectric conversion elements 12. The light filter structure 104 includes a dielectric-stacking layer 24 disposed on the substrate 10. In this embodiment, the dielectric-stacking layer 24 may include a wedge portion 24-1 and a flattening portion 24-3 adjacent to the wedge portion 24-1 as shown in FIG. 5. The light filter structure 104 further includes a flattening layer 30 disposed on the dielectric-stacking layer 24. In some embodiments, the light filter structure 104 may further include a first light-shielding layer 41 disposed on the flattening layer 30 and at least one second light-shielding layer 43 disposed inside the flattening layer 30 and on the dielectric-stacking layer 24.

The wedge portion 24-1 of the dielectric-stacking layer 24 shown in FIG. 5 may be different from the wedge portion 20-1 of the dielectric-stacking layer 20 shown in FIG. 1 and FIG. 2. For example, the wedge portion 24-1 of the dielectric-stacking layer 24 may have a continuously varied thickness, but the wedge portion 24-1 of the dielectric-stacking layer 24 may gradually thicken from the side close to the flattening portion 24-3 to the side farther away from the flattening portion 24-3 as shown in FIG. 5. That is, the thickness of the wedge portion 24-1 close to the flattening portion 24-3 may be less than the thickness of the wedge portion 24-1 farther away from the flattening portion 24-3. However, the present disclosure is not limited thereto.

Similarly, the dielectric-stacking layer 24 may include alternately stacked first dielectric layers 21 and second dielectric layers 23 as shown in FIG. 5, and the refractive index of each of the first dielectric layers 21 may be different from the refractive index of each of the second dielectric layers 23. For example, the refractive index of the first dielectric layer 21 may be greater than the refractive index of the second dielectric layer 23, but the present disclosure is not limited thereto. In other embodiments, the refractive index of the first dielectric layer 21 may be less than the refractive index of the second dielectric layer 23.

In FIG. 5, the dielectric-stacking layer 24 includes four first dielectric layers 21 and four second dielectric layers 23 disposed on the substrate 10, but the number of first dielectric layers 21 and the number of second dielectric layers 23 are not limited thereto. In some embodiments, the number of first dielectric layers 21 and the number of second dielectric layers 23 may be adjusted depending on demand.

Correspondingly, each of the first dielectric layers 21 in the wedge portion 24-1 may gradually thicken from the side close to the flattening portion 24-3 to the side farther away from the flattening portion 24-3, and each of the second dielectric layers 23 in the wedge portion 24-1 may gradually thicken from the side close to the flattening portion 24-3 to the side farther away from the flattening portion 24-3 as shown in FIG. 5. That is, in the wedge portion 24-1, the thickness of the first dielectric layers 21 close to the flattening portion 24-3 may be less than the thickness of the first dielectric layers 21 farther away from the flattening portion 24-3, and the thickness of the second dielectric layers 23 close to the flattening portion 24-3 may be less than the thickness of the second dielectric layers 23 farther away from the flattening portion 24-3. However, the present disclosure is not limited thereto.

Similarly, the dielectric-stacking layer 24 may further include another wedge portion 24-2 adjacent to the flattening portion 24-3; that is, the wedge portion 24-1 may be disposed on one side of the flattening portion 24-3, and the wedge portion 24-2 may be disposed on another side of the flattening portion 24-3 as shown in FIG. 5. In some embodiments, the wedge portion 24-2 may be similar to the wedge portion 24-1. For example, the wedge portion 24-2 may have a continuously varied thickness, and the wedge portion 24-2 may be symmetrical to the wedge portion 24-1, but the present disclosure is not limited thereto. In other embodiments, the wedge portion 24-2 may be similar to the wedge portion 22-2 (which has a non-continuously varied thickness) shown in FIG. 3, or the wedge portion 24-2 may be asymmetrical to the wedge portion 24-1 (e.g., the width of the wedge portion 24-2 may be greater or less than the width of the wedge portion 24-1).

In some embodiments, the wavelength of the light transmitted to the photoelectric conversion elements 12 may depend on the thickness the dielectric-stacking layer 24. For example, among the photoelectric conversion elements 12 that correspond to the wedge portion 24-1, the closer a photoelectric conversion element 12 is to the flattening portion 24-3, the shorter the wavelength of the light transmitted to the photoelectric conversion element 12 is; the wavelength of the light transmitted to the photoelectric conversion elements 12 that correspond to the flattening portion 24-3 are greater than the wavelength of the light transmitted to the photoelectric conversion elements 12 that correspond to wedge portion 24-1 in the embodiment shown in FIG. 5. Therefore, the red light may be transmitted to the photoelectric conversion element 12C or 12P, and the blue light may be transmitted to the photoelectric conversion element 12F as shown in FIG. 5, but the present disclosure is not limited thereto.

Referring to FIG. 6, the light filter structure 106 includes a substrate 10. Similarly, the substrate 10 may have a plurality of photoelectric conversion elements 12. The light filter structure 106 includes a dielectric-stacking layer 26 disposed on the substrate 10. In this embodiment, the dielectric-stacking layer 26 may include a wedge portion 26-1 and a flattening portion 26-3 adjacent to the wedge portion 26-1 as shown in FIG. 6. The light filter structure 106 further includes a flattening layer 30 disposed on the dielectric-stacking layer 26. In some embodiments, the light filter structure 106 may further include a first light-shielding layer 41 disposed on the flattening layer 30 and at least one second light-shielding layer 43 disposed inside the flattening layer 30 and on the dielectric-stacking layer 26.

The differences from the light filter structure 104 shown in FIG. 5 may include that the wedge portion 26-1 of the dielectric-stacking layer 26 shown in FIG. 6 may have a non-continuously varied thickness. For example, the wedge portion 26-1 of the dielectric-stacking layer 26 may have a step shape, but the present disclosure is not limited thereto.

Similarly, the dielectric-stacking layer 26 may include alternately stacked first dielectric layers 21 and second dielectric layers 23 as shown in FIG. 6, and the refractive index of each of the first dielectric layers 21 may be different from the refractive index of each of the second dielectric layers 23. For example, the refractive index of the first dielectric layer 21 may be greater than the refractive index of the second dielectric layer 23, but the present disclosure is not limited thereto. In other embodiments, the refractive index of the first dielectric layer 21 may be less than the refractive index of the second dielectric layer 23.

In FIG. 6, the dielectric-stacking layer 26 includes three first dielectric layers 21 and three second dielectric layers 23 disposed on the substrate 10, but the number of first dielectric layers 21 and the number of second dielectric layers 23 are not limited thereto. In some embodiments, the number of first dielectric layers 21 and the number of second dielectric layers 23 may be adjusted depending on demand.

In some embodiments, the wedge portion 26-1 of the dielectric-stacking layer 26 may gradually (but non-continuously) thicken from the side close to the flattening portion 26-3 to the side farther away from the flattening portion 26-3 as shown in FIG. 6. That is, the thickness of the wedge portion 26-1 close to the flattening portion 26-3 may be less than the thickness of the wedge portion 26-1 farther away from the flattening portion 26-3. However, the present disclosure is not limited thereto.

Correspondingly, each of the first dielectric layers 21 in the wedge portion 26-1 may gradually (but non-continuously) thicken from the side close to the flattening portion 26-3 to the side farther away from the flattening portion 26-3, and each of the second dielectric layers 23 in the wedge portion 26-1 may gradually (but non-continuously) thicken from the side close to the flattening portion 26-3 to the side farther away from the flattening portion 26-3 as shown in FIG. 6. That is, in the wedge portion 26-1, the thickness of the first dielectric layers 21 close to the flattening portion 26-3 may be less than the thickness of the first dielectric layers 21 farther away from the flattening portion 26-3, and the thickness of the second dielectric layers 23 close to the flattening portion 26-3 may be less than the thickness of the second dielectric layers 23 farther away from the flattening portion 26-3. However, the present disclosure is not limited thereto.

Similarly, the dielectric-stacking layer 26 may further include another wedge portion 26-2 adjacent to the flattening portion 26-3; that is, the wedge portion 26-1 may be disposed on one side of the flattening portion 26-3, and the wedge portion 26-2 may be disposed on another side of the flattening portion 26-3 as shown in FIG. 6. In some embodiments, the wedge portion 26-2 may be similar to the wedge portion 26-1. For example, the wedge portion 26-2 may have a non-continuously varied thickness, and the wedge portion 26-2 may be symmetrical to the wedge portion 26-1, but the present disclosure is not limited thereto. In other embodiments, the wedge portion 26-2 may be similar to the wedge portion 24-2 (which has a continuously varied thickness) shown in FIG. 5, or the wedge portion 26-2 may be asymmetrical to the wedge portion 26-1 (e.g., the width of the wedge portion 26-2 may be greater or less than the width of the wedge portion 26-1).

In some embodiments, the wavelength of the light transmitted to the photoelectric conversion elements 12 may depend on the thickness the dielectric-stacking layer 26. For example, among the photoelectric conversion elements 12 that correspond to the wedge portion 26-1, the closer a photoelectric conversion element 12 is to the flattening portion 26-3, the shorter the wavelength of the light transmitted to the photoelectric conversion element 12 is; the wavelength of the light transmitted to the photoelectric conversion elements 12 that correspond to the flattening portion 26-3 are greater than the wavelength of the light transmitted to the photoelectric conversion elements 12 that correspond to wedge portion 26-1 in the embodiment shown in FIG. 6. Therefore, the red light may be transmitted to the photoelectric conversion element 12C or 12P, and the blue light may be transmitted to the photoelectric conversion element 12F as shown in FIG. 6, but the present disclosure is not limited thereto.

Figure 7:
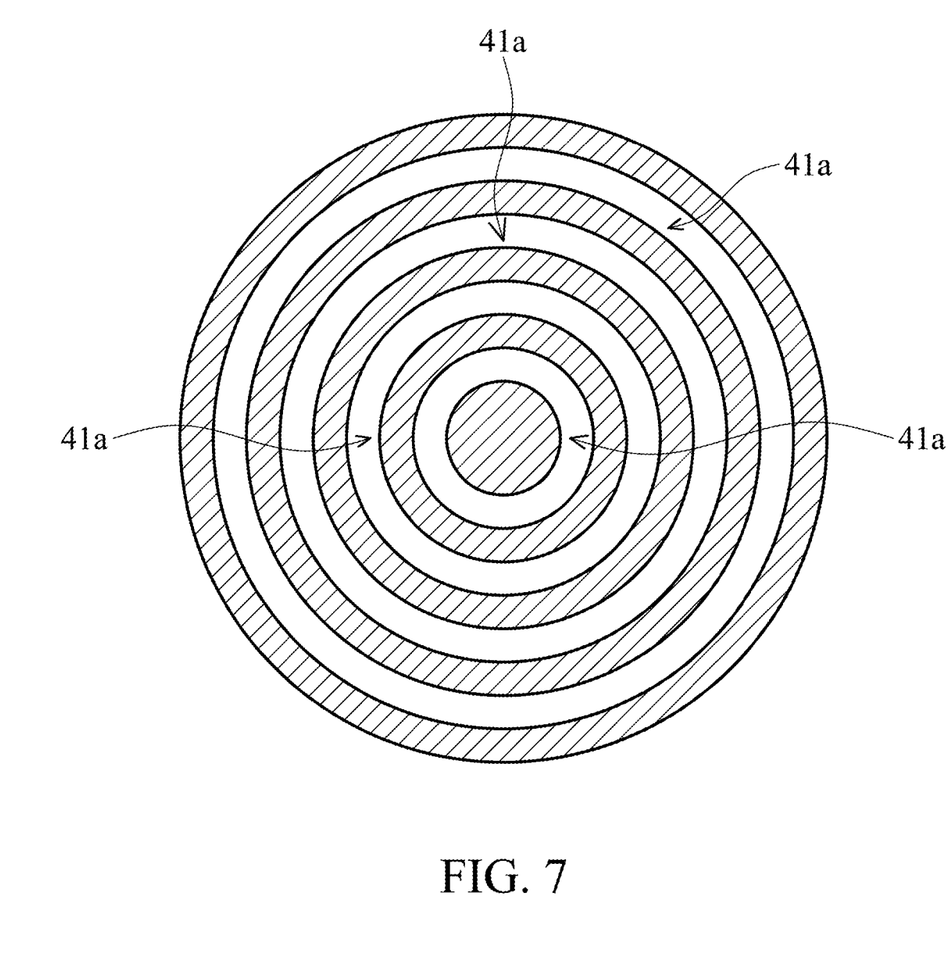
FIG. 7 is a partial top view illustrating the apertures of the first light-shielding layer according to one embodiment of the present disclosure.

FIG. 7 is a partial top view illustrating the apertures 41a of the first light-shielding layer 41 according to one embodiment of the present disclosure. It should be noted that a partial top view illustrating the apertures 43a of the second light-shielding layer 43 according to one embodiment of the present disclosure may be similar to FIG. 7.

In some embodiments, the apertures 41a of the first light-shielding layer 41 may form a symmetrical pattern. For example, the apertures 41a of the first light-shielding layer 41 may be arranged in concentric circles as shown in FIG. 7, but the present disclosure is not limited thereto.

In summary, when the light filter structure of the embodiment according to the present disclosure is used as a narrow-band pass filter (e.g., the spectral inspection device), the (spectral) resolution may be enhanced by adjusting the sizes of the apertures of the light-shielding layer. Moreover, the light filter structure of the embodiment according to the present disclosure may be low angle dependency. Therefore, the deformation of the spectrum due to oblique incident-light transmitted to the light filter structure of the embodiments according to the present disclosure may be reduced.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure. Therefore, the scope of protection should be determined by the claims. In addition, although some embodiments of the present disclosure are disclosed above, they are not intended to limit the scope of the present disclosure.

Reference throughout this specification to features, advantages, or similar language does not imply that all of the features and advantages that may be realized with the present disclosure should be or are in any single embodiment of the disclosure. Rather, language referring to the features and advantages is understood to mean that a specific feature, advantage, or characteristic described in connection with an embodiment is included in at least one embodiment of the present disclosure. Thus, discussions of the features and advantages, and similar language, throughout this specification may, but do not necessarily, refer to the same embodiment.

Furthermore, the described features, advantages, and characteristics of the disclosure may be combined in any suitable manner in one or more embodiments. One skilled in the relevant art will recognize, in light of the description herein, that the disclosure can be practiced without one or more of the specific features or advantages of a particular embodiment. In other instances, additional features and advantages may be recognized in certain embodiments that may not be present in all embodiments of the disclosure.

What is claimed is:

1. A light filter structure, comprising:
a substrate having a plurality of photoelectric conversion elements;
a flattening layer disposed on the substrate; and
a dielectric-stacking layer disposed between the substrate and the flattening layer and consisting of at least two different dielectric layers,
wherein the dielectric-stacking layer has a wedge portion and a flattening portion adjacent to the wedge portion, each of the at least two different dielectric layers in the wedge portion has a continuously or non-continuously varied thickness, and each of the at least two different dielectric layers in the flattening portion has a constant thickness.

2. The light filter structure as claimed in claim 1, wherein the dielectric-stacking layer comprises alternately stacked first dielectric layers and second dielectric layers, and a refractive index of each of the first dielectric layers is different from a refractive index of each of the second dielectric layers.

3. The light filter structure as claimed in claim 2, wherein the refractive index of each of the first dielectric layers is between 2 and 2.5.

4. The light filter structure as claimed in claim 3, wherein a material of each of the first dielectric layers comprises zirconium dioxide, tantalum pentoxide, niobium pentoxide, zinc sulfide, titanium dioxide, indium tin oxide, stannic oxide, or zinc oxide.

5. The light filter structure as claimed in claim 2, wherein the refractive index of each of the second dielectric layers is between 1.2 and 1.8.

6. The light filter structure as claimed in claim 5, wherein a material of each of the second dielectric layers comprises calcium fluoride, magnesium fluoride, lanthanum trifluoride, silicon dioxide, aluminium oxide, or hafnium dioxide.

7. The light filter structure as claimed in claim 2, wherein each of the first dielectric layers in the wedge portion has a continuously or non-continuously varied thickness, and each of the second dielectric layers in the wedge portion has a continuously or non-continuously varied thickness.

8. The light filter structure as claimed in claim 2, wherein the wedge portion gradually thins from a side close to the flattening portion to a side farther away from the flattening portion.

9. The light filter structure as claimed in claim 2, wherein the wedge portion gradually thickens from a side close to the flattening portion to a side farther away from the flattening portion.

10. The light filter structure as claimed in claim 1, further comprising:
a plurality of light-shielding layers disposed on the dielectric-stacking layer.

11. The light filter structure as claimed in claim 10, wherein the plurality of light-shielding layers comprises:
a first light-shielding layer disposed on a top surface of the flattening layer;
at least one second light-shielding layer disposed inside the flattening layer and on the dielectric-stacking layer.

12. The light filter structure as claimed in claim 11, wherein the first light-shielding layer comprises a plurality of first apertures and the at least one second light-shielding layer comprises a plurality of second apertures.

13. The light filter structure as claimed in claim 12, wherein the plurality of first apertures corresponds to the plurality of second apertures.

14. The light filter structure as claimed in claim 12, wherein each of the plurality of first apertures corresponds to one of the plurality of photoelectric conversion elements, and each of the plurality of second apertures corresponds to one of the plurality of photoelectric conversion elements.

15. The light filter structure as claimed in claim 12, wherein a width of each of the plurality of first apertures in a direction parallel with a top surface of the substrate is greater than 1 µm and less than 150 µm, and a width of each of the plurality of second apertures in the direction parallel with the top surface of the substrate is greater than 1 µm and less than 150 µm.

16. The light filter structure as claimed in claim 15, wherein the width of each of the plurality of first apertures is different from the width of each of the plurality of second apertures.

17. The light filter structure as claimed in claim 15, wherein the plurality of first apertures and the plurality of second apertures limit an incident angle of light to between 0 and 10°.

18. The light filter structure as claimed in claim 15, wherein the plurality of first apertures forms a symmetrical pattern.

19. The light filter structure as claimed in claim 18, wherein the plurality of first apertures is arranged in concentric circles.

20. The light filter structure as claimed in claim 1, wherein the wedge portion surrounds the flattening portion.

* * * * *